(12) United States Patent
Madan et al.

(10) Patent No.: US 6,809,954 B1
(45) Date of Patent: Oct. 26, 2004

(54) CIRCUIT AND METHOD FOR REDUCING ACCESS TRANSISTOR GATE OXIDE STRESS

(75) Inventors: Sudhir K. Madan, Richardson, TX (US); Hugh McAdams, McKinney, TX (US); John Y. Fong, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/614,299

(22) Filed: Jul. 2, 2003

(51) Int. Cl.[7] .............................................. G11C 11/22
(52) U.S. Cl. ........................... 365/145; 365/149; 365/65
(58) Field of Search ................................. 365/145, 149, 365/65

(56) References Cited

U.S. PATENT DOCUMENTS 5,608,667 A * 3/1997 Osawa .......................... 365/145
6,046,926 A * 4/2000 Tanaka et al. ............... 365/145
6,741,489 B2 * 5/2004 Takasu et al. ............... 365/145

OTHER PUBLICATIONS

Ali Sheikholeslami et al., *A Survey of Circuit Innovations in Ferroelectric Random–Access Memories,* Proc. of the IEEE, vol. 88, No. 5, 667 (May 2000).
Ali Sheikholeslami, *Ferroelectric Memory Design (FeRAM 101),* ISSCC 2002 Tutorial (Feb. 3, 2002).

* cited by examiner

*Primary Examiner*—Connie C. Yoha
(74) *Attorney, Agent, or Firm*—Jacqueline J. Garner; W. James Brady, III; Frederick J. Telecky, Jr.

(57) ABSTRACT

A memory circuit and method for reducing gate oxide stress is disclosed. The circuit includes a memory cell for storing data. The memory cell has a first 106 and a second 110 control terminal and a pass transistor 102. The pass transistor has a control gate coupled to the first control terminal. The memory circuit includes a drive circuit 900 having an output terminal 912 coupled to the second control terminal. The drive circuit is arranged to produce a control signal PL having a rise time and a fall time, wherein the fall time is greater than the rise time.

28 Claims, 5 Drawing Sheets

CIRCUIT AND METHOD FOR REDUCING ACCESS TRANSISTOR GATE OXIDE STRESS

FIELD OF THE INVENTION

This invention generally relates to electronic circuits, and more specifically to nonvolatile semiconductor integrated circuits.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. However, both ferroelectric materials suffer from fatigue and imprint. Fatigue is characterized by a gradual decrease in net stored charge with repeated cycling of a ferroelectric capacitor. Imprint is a tendency to prefer one state over another if the ferroelectric capacitor remains in that state for a long time as will be discussed in detail.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying –Vmax to the ferroelectric capacitor. This charges the linear and switching components of the ferroelectric capacitor to a saturation charge of –Qs. The stored charge reverts to –Qr when the voltage across the ferroelectric capacitor is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to –Qs. When plateline PL goes high, the voltage across the ferroelectric capacitor is 0 V, and the stored charge reverts to –Qr. At the end of the write cycle, both bitline BL and plateline PL go low and stored charge –Qr remains on the ferroelectric capacitor. Alternatively, the write "0" occurs when bitline BL remains low and plateline PL goes high. This places a positive voltage across the ferroelectric capacitor and charges it to Qs representing a stored "0". When plateline PL goes low, the voltage across the ferroelectric capacitor is 0 V, and the stored charge reverts to Qr representing a stored "0".

A read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $\Delta t_0$ bitline precharge signal PRE goes low, permitting the bitlines BL to float. At time $\Delta t_1$ both wordline WL and plateline PL go high, thereby permitting each memory cell to share charge with a respective bitline. A stored "1" will share more charge with parasitic bitline capacitance $C_{BL}$ and produce a greater bitline voltage than the stored "0" as shown. A reference voltage (not shown) is produced at each complementary bitline of an accessed bitline. This reference voltage is between the "1" and "0" voltages. Sense amplifiers are activated at the time boundary between $\Delta t_1$ and $\Delta t_2$. When respective bitline voltages are fully amplified in time $\Delta t_2$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $\Delta t_3$, plateline PL goes low and applies –Vmax to the read "1" cell, thereby storing −Qs. At the same time, zero voltage is applied to the read "0" cell and charge Qr is restored. At the end of time $\Delta t_3$, signal PRE goes high and precharges both bitlines BL to zero volts or ground. Thus, zero volts is applied to the read "1" cell and −Qr is restored.

Referring to FIGS. 5A and 5B, there are timing diagrams illustrating two different types of sensing that may be used in ferroelectric memory circuits. A primary difference between these two schemes is that the step sensing scheme (FIG. 5A) uses a single pulse of plateline PL, while the pulse sensing scheme (FIG. 5B) uses a double pulse of plateline PL. For both types of sensing, bitline precharge signal PRE goes low at time $t_0$, thereby permitting the bitlines BL to float. Next, wordline WL goes high at time $t_1$ to turn on access transistors of a row of memory cells. Plateline PL goes high between times $t_1$ and $t_2$, permitting ferroelectric memory cells share charge with their respective bitlines BL and develop respective difference voltages. Here, $V_1$ represents a data "1" and $V_0$ represents a data "0". The difference voltage available for sensing is the difference between one of $V_1$ and $V_0$ and a reference voltage (not shown) which lies approximately midway between voltages $V_1$ and $V_0$. This difference voltage is amplified at time $t_3$ for the step sensing scheme (FIG. 5A) so that full bitline BL voltages are developed before the plateline PL goes low at time $t_4$. The data "0" cell is fully restored between time $t_3$ and time $t_4$ while plateline PL is high and the data "0" bitline BL is low. At time $t_4$, the plateline PL goes low while the data "1" bitline BL remains high. Thus, the data "1" cell is restored between time $t_4$ and time $t_5$. Bitline precharge signal PRE goes high at time $t_5$, thereby precharging the bitlines BL to ground or 0 V. The step sensing cycle is completed when wordline WL goes low at time $t_6$ to store respective data in the row of memory cells.

Referring now to FIG. 5B, the first pulse of plateline PL develops a difference voltage at time $t_2$. Plateline PL then goes low at time $t_3$, and the common mode difference voltage goes to near 0 V. Then the difference voltage is amplified at time $t_4$, and full bitline BL voltages are developed while the plateline PL is low. Thus, the data "1" cell is restored between time $t_4$ and time $t_5$ while plateline PL is low and the data "1" bitline BL is high. At time $t_5$, the plateline PL goes high while the data "0" bitline BL remains low. Thus, the data "0" cell is restored between time $t_5$ and time $t_6$. The data "1" cell is again restored between time $t_6$ and time $t_7$ while plateline PL is low and the data "1" bitline BL is high. Bitline precharge signal PRE goes high at time $t_7$, thereby precharging the bitlines BL to ground or 0 V. The pulse sensing cycle is completed when wordline WL goes low at time $t_8$.

Turning now to FIG. 6, there is a plateline PL drive circuit of the prior art. The drive circuit comprises a CMOS inverter formed by P-channel transistor 600 and N-channel transistor 602. The input terminal 604 of the inverter is coupled to receive plate line control signal /CTL_PLT. The inverter output terminal 606 is connected to parasitic plate capacitor $C_{PLATE}$ 608, and produces plateline signal PL (FIG. 5). Parasitic plate capacitor $C_{PLATE}$ 608 preferably represents capacitance of a plateline for at least a portion of a wordline of ferroelectric memory cells. As such, this large plateline capacitance $C_{PLATE}$ 608 requires large drive transistors 600 and 602 to minimize plateline PL rise and fall times, thereby minimizing sense and write cycle times. Since N-channel transistors typically have at least twice the mobility of P-channel transistors, the N-channel transistor typically has a width W/2 that is one-half the width W of the P-channel transistor, thereby providing approximately the same rise and fall times of plateline signal PL. A problem with this plate drive circuit of the prior art occurs, however, when the plateline PL of a ferroelectric memory cell goes from high to low on a bitline BL that is also driven low. For example, the pulse sensing scheme of FIG. 7 illustrates the double pulse of the plateline PL. During the first high-to-low transition of plateline PL at time $t_1$, the bitline BL is floating as described at FIG. 5B. During the second high-to-low transition of plateline PL at time $t_3$, however, the bitline BL is driven low to restore a data "0", and induces significant gate oxide stress, as will be explained in detail, on N-channel pass gate transistor 102 (FIG. 1). This gate oxide stress poses a significant long-term reliability hazard, since the high-to-low transition of plateline PL for a driven low bitline BL will happen for approximately half of all read and write operations.

Referring now to FIG. 8, there is a simplified diagram to illustrate the induced gate oxide stress on N-channel pass gate transistor 102. Here, the same reference numerals are used as in FIG. 1 to show comparable elements of the ferroelectric memory cell. During any read or write operation of a data "0", bitline BL 108 is driven low and plateline PL 110 is driven high to restore or write a data "0" on ferroelectric capacitor 100. During burn-in, preferable wordline voltages at the gate terminal 106 and plateline voltage at terminal 110 are both 2.5 V. Resistance $R_{GATE}$ 114 of N-channel pass gate transistor 102 is approximately 500Ω. Ferroelectric capacitor 100 has a value of approximately 30 fF. A rapid transition of plateline terminal 110 from 2.5 V to 0 V over a 100 ps period will induce an average current through resistor $R_{GATE}$ 114 of about 1400 μA. This current will develop −0.7 V at storage node 112, the source of N-channel pass gate transistor 102. The resulting gate-to-source voltage of N-channel pass gate transistor 102 is 3.2 V. This produces an excessive electric field across the gate oxide between the gate 106 and source 112 terminals, and poses a significant reliability hazard. Moreover, at a source voltage of −0.7 V, the parasitic source-to-substrate diode 116 is strongly forward biased and will inject a substantial number of minority carriers (electrons) into the substrate. The resulting injection from a row of memory cells may be sufficient to induce latchup between parasitic PNP and NPN transistors in the CMOS circuit. Moreover, the injection may reduce local substrate bias, thereby reducing access transistor threshold voltages of nearby unaccessed memory cells. Even during normal circuit operation, the average current through resistor $R_{GATE}$ 114 is about 300 μA. The corresponding wordline voltage at terminal 106 is 2.0 V, and −0.15 V is induced on storage node 112. Thus, even under normal operating conditions, the high-to-low transition of plateline terminal 110 develops 2.15 V across the gate oxide of N-channel pass gate transistor 102. This is well above the normal maximum wordline voltage and also poses a long-term reliability hazard for the ferroelectric memory cell.

SUMMARY OF THE INVENTION

In accordance with a preferred embodiment of the invention, there is disclosed a memory circuit for reducing gate oxide stress. The circuit comprises a memory cell for storing data. The memory cell has a first and a second control terminal and a pass gate transistor. The pass transistor has a control gate coupled to the first control terminal. The memory circuit includes a drive circuit having an output terminal coupled to the second control terminal. The drive circuit is arranged to produce a control signal having a rise time and a fall time, wherein the fall time is greater than the rise time. The increased fall time reduces negative voltage at

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 9:
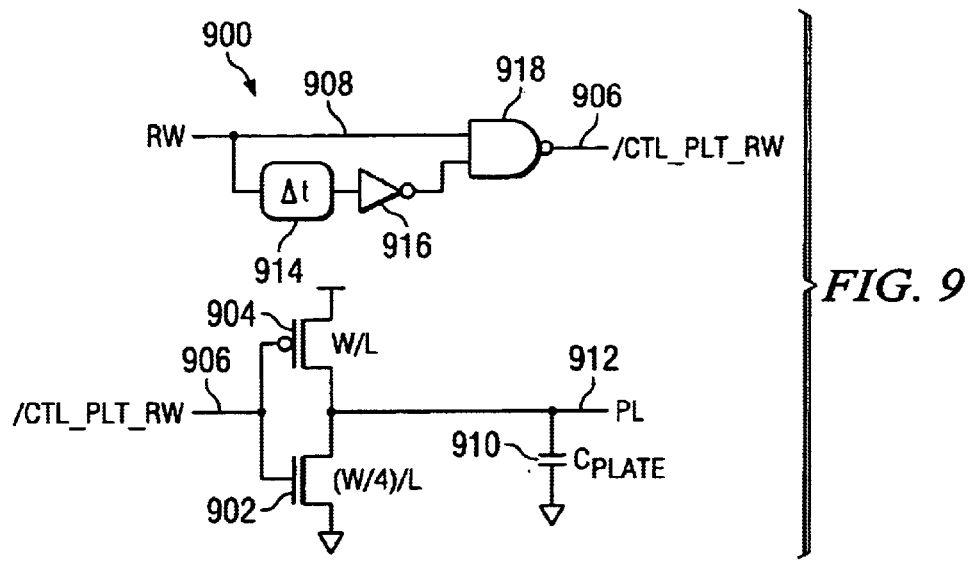
FIG. 9 is circuit diagram of a first embodiment of the plateline drive circuit of the present invention.
Figure 10:
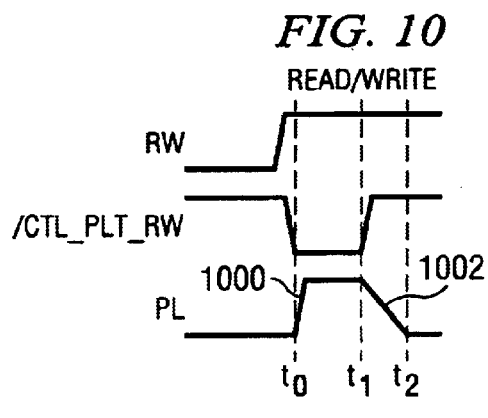
FIG. 10 is a timing diagram of the plateline drive circuit of FIG. 9.

Referring to FIGS. 9 and 10, there is a plateline drive circuit 900 of the present invention. Control logic for the plateline drive circuit is a pulse generator circuit including delay circuit 914, inverter 916, and NAND gate 918. The plateline drive circuit includes P-channel transistor 904 and N-channel transistor 902 configured as a CMOS inverter. The P-channel transistor 904 has a width W and a length L. The N-channel transistor 902 has a width W/4 and a length L. The ratio of width-to-length of the P-channel transistor 904 to the N-channel transistor 902, therefore, is preferably at least 4. Both transistors are coupled to receive input signal /CTL_PLT_RW at input terminal 906. Output terminal 912 is coupled to a plateline represented by parasitic capacitance $C_{PLATE}$ 910.

In operation, the pulse generator circuit receives read/write signal RW at lead 908. While signal RW is low, the output signal from inverter 916 is high. Thus, NAND gate 918 produces a high output signal /CTL_PLT_RW on lead 906. This high level output signal is applied to the CMOS inverter formed by P-channel transistor 904 and N-channel transistor 902. The output signal PL of the CMOS inverter is, therefore, low. Before time $t_0$, read/write signal RW goes high. This produces two high level input signals at NAND gate 918 and a low output signal /CTL_PLT_RW on lead 902. This low output signal produces a high level plateline drive signal PL on lead 912 at time $t_0$. Both input signals at NAND gate 918 remain high for time $\Delta t$, as determined by delay circuit 914. Then after time $\Delta t$, the output signal of inverter 916 goes low. This low level input signal produces a high level signal /CTL_PLT_RW at the output of NAND gate 918 at time $t_1$. This high level signal /CTL_PLT_RW turns off P-channel transistor 904 and turns on N-channel transistor 902. N-channel transistor 902, however, has a narrow width W/4. The narrow width produces a slow fall time 1002 of plateline drive signal PL from $t_1$ to $t_2$. This slow fall time 1002 is preferably at least twice the rise time 1000 of plateline drive signal PL. Referring back to FIG. 8, current I through N-channel pass gate resistance 114 is equal to the product of C (30 fF) and the rate of change of voltage of plateline drive signal PL dv/dt. Thus, a reduction of width of N-channel transistor 902 from W/2 to W/4 will increase the fall time by a factor of two, thereby reducing current through N-channel pass gate resistance 114 by a factor of two. During burn-in, therefore, current through resistance 114 only produces −0.35 V at storage node 112. Thus, the maximum gate-to-source voltage of pass gate transistor 102 is reduced from 3.2 V to 2.85 V. Moreover, the parasitic source-to-substrate diode 116 is no longer strongly forward biased, so minority carrier injection and the latchup potential is reduced. Furthermore, in normal operation, the current through resistance 114 is reduced from 300 μA to 150 μA. Thus, the gate-to-source voltage will only increase from 2.0 V to 2.075 V due to capacitive coupling. This reduction in gate-to-source voltage of pass gate transistor 102 is highly advantageous for reliability of the ferroelectric memory circuit. Furthermore, a greater reduction in width of N-channel transistor 906 to W/6 or W/8 practically eliminates capacitive coupling and resulting gate-to-source voltage increases at the pass gate transistor.

Figure 1:
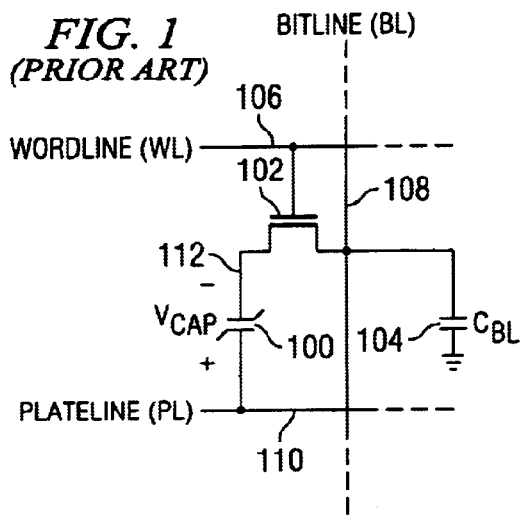
FIG. 1 is a circuit diagram of a ferroelectric memory cell of the prior art.
Figure 2:
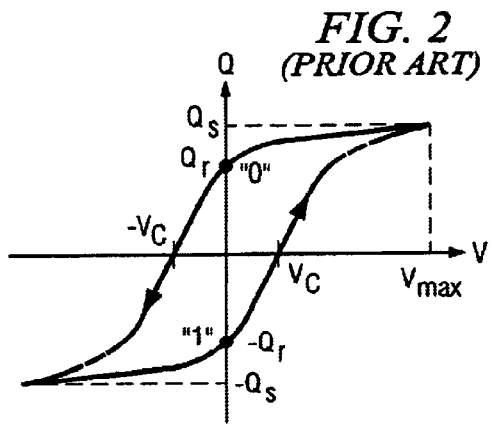
FIG. 2 is a hysteresis curve of the ferroelectric capacitor 100 of FIG. 1.
Figure 3:
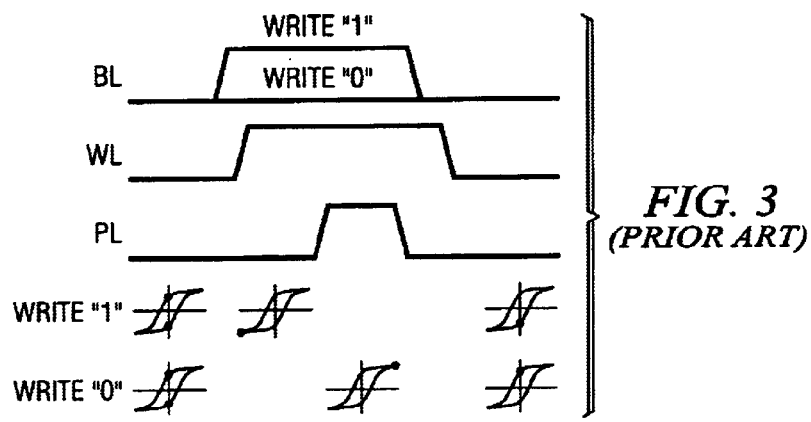
FIG. 3 is a timing diagram showing a write operation to the ferroelectric memory cell of FIG. 1.
Figure 4:
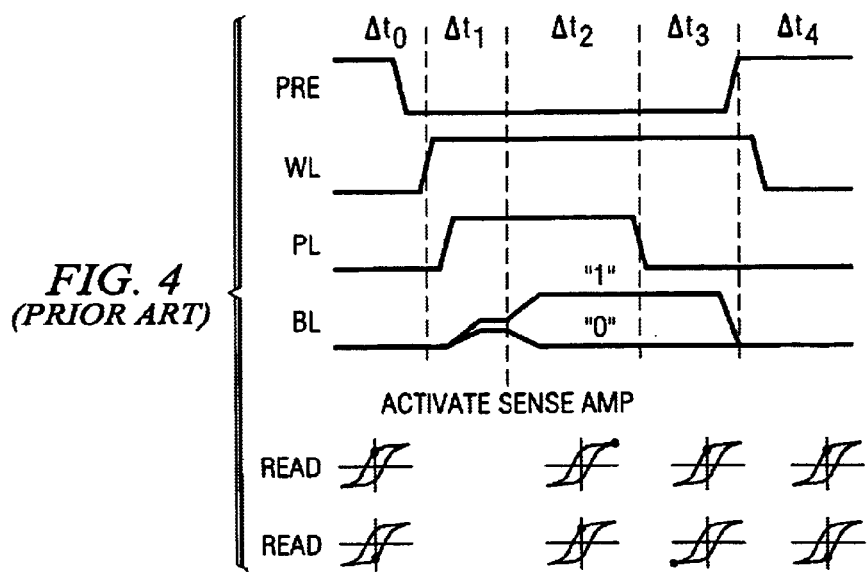
FIG. 4 is a timing diagram showing a read operation from the ferroelectric memory cell of FIG. 1.
Figure 5A:
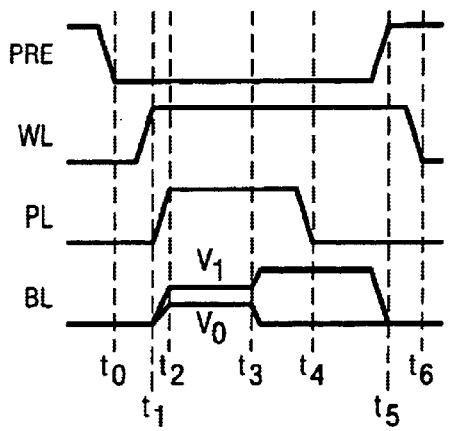
FIG. 5A is a timing diagram of a step sense read cycle.
Figure 5B:
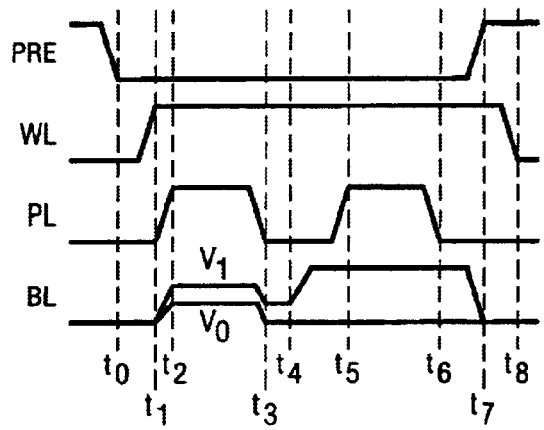
FIG. 5B is a timing diagram of a pulse sense read cycle.
Figure 6:
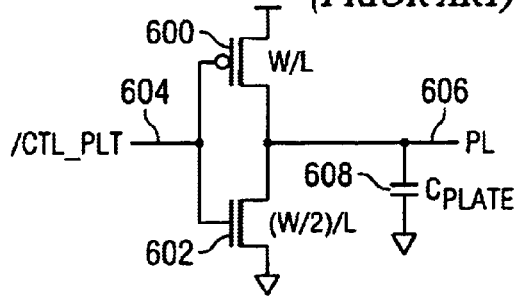
FIG. 6 is a circuit diagram of a plateline drive circuit of the prior art.
Figure 7:
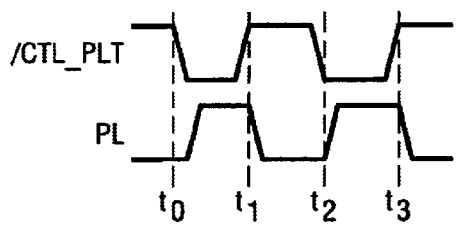
FIG. 7 is a timing diagram of the plateline drive circuit of FIG. 6.
Figure 12:
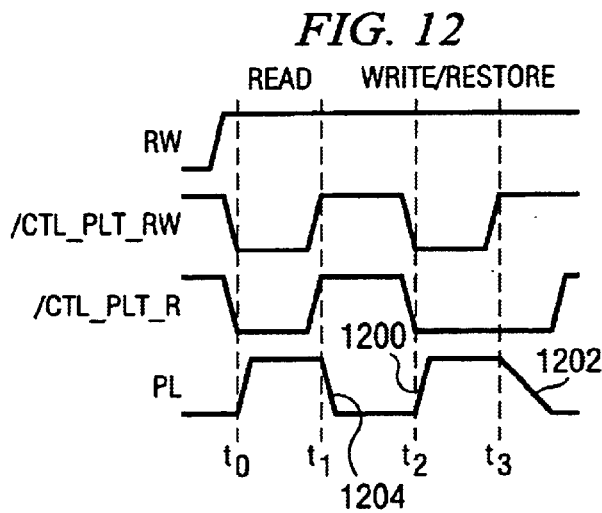
FIG. 12 is a timing diagram of the plateline drive circuit of FIG. 11.
Figure 11:
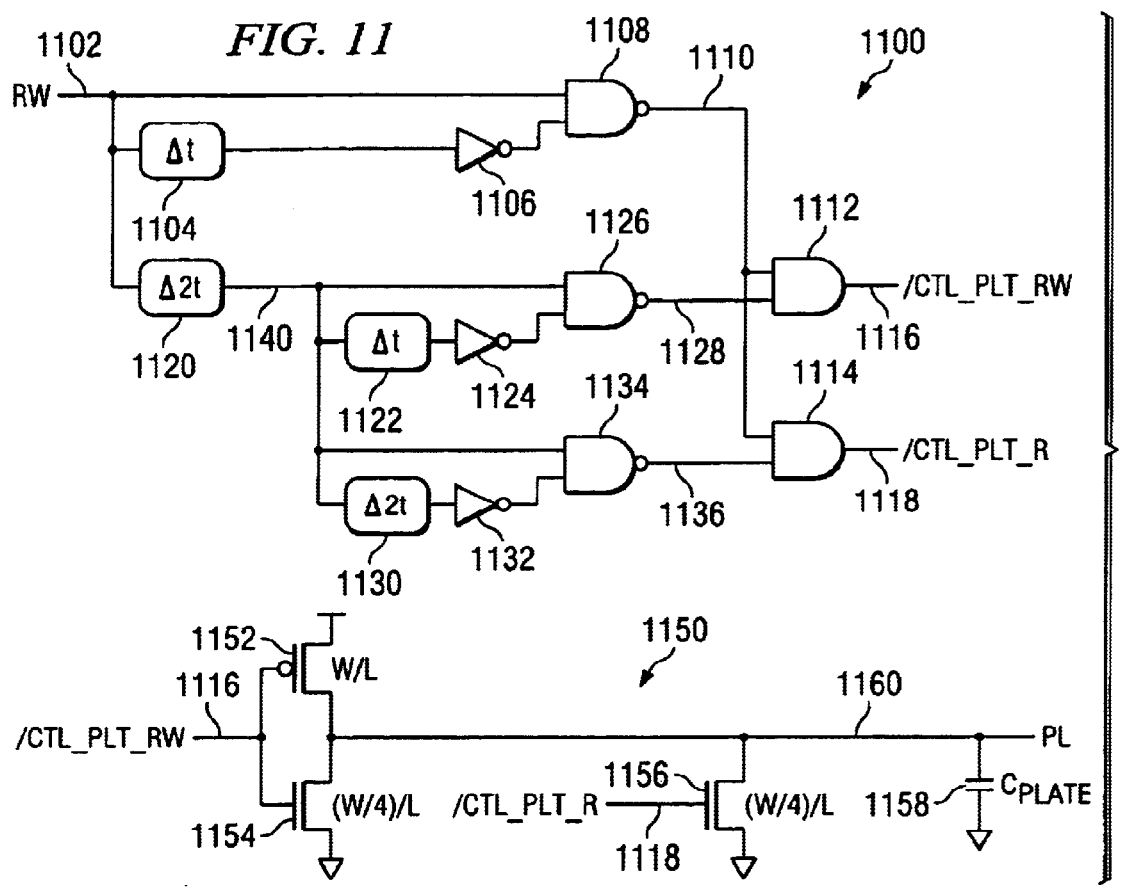
FIG. 11 is circuit diagram of a second embodiment of the plateline drive circuit of the present invention.

Referring now to FIGS. 11 and 12, a second embodiment of the present invention will be explained in detail. The memory circuit of FIG. 11 includes a control circuit 1100 and a plateline drive circuit 1150 for reducing gate oxide stress in a pulse sense memory circuit as described at FIG. 5B. The control circuit includes three separate pulse generator circuits, each having a delay circuit, an inverter, and a NAND gate. A first pulse generator circuit includes delay circuit 1104, inverter 1106, and NAND gate 1108. The first pulse generator circuit receives read/write control signal RW on lead 1102 and produces a first low level pulse having a time duration $\Delta t$ on lead 1110. This low level pulse on lead 1110 is applied to AND gates 1112 and 1114, thereby producing low level output signals /CTL_PLT_RW and /CTL_PLT_R on leads 1116 and 1118, respectively, between time $t_0$ and $t_1$. The low level output signal /CTL_PLT_RW is applied to a CMOS inverter formed by P-channel transistor 1152 and N-channel transistor 1154, thereby turning off N-channel transistor 1154 and turning on P-channel transistor 1152. In a similar manner, the low level output signal /CTL_PLT_R is applied to N-channel transistor 1156, thereby turning it off. Responsively, P-channel transistor 1152 produces a high level plateline signal PL on lead 1160 at time $t_0$.

After time $\Delta t$, a delayed signal RW is applied to inverter 1106, which produces a low level signal at an input terminal of NAND gate 1108. This low level signal produces a high level output signal on lead 1110. The high level output on lead 1110 returns control signals /CTL_PLT_RW and /CTL_PLT_R to their previous high level at time $t_1$. The high level output signal /CTL_PLT_RW turns off P-channel transistor 1152 and turns on N-channel transistor 1154. Likewise, the high level output signal /CTL_PLT_R turns on N-channel transistor 1156. Both N-channel transistors 1154 and 1156, therefore, drive plateline signal PL on lead 1160 low. Since each of N-channel transistors 1154 and 1156 have widths of W/4, their combined width is W/2. The ratio of width-to-length of P-channel transistor 1152 to the combined N-channel transistors, therefore, is 2. This produces a rapid fall time 1204 at $t_1$ that is approximately equal to the rise time at $t_0$. These minimal rise and fall times advantageously allow minimal read and write cycle times. Furthermore, there is no consequent increase in gate-to-source voltage, as described at FIG. 5B, since bitline signal BL is floating at intermediate voltage $V_0$ between times $t_0$ and time $t_1$ when plateline signal PL makes a high-to-low transition.

Delay circuit 1120 receives read/write control signal RW on lead 1102 and produces a delayed version of signal RW on lead 1140 after a Δ2t time delay. This delayed signal RW is applied to common input terminals of a second and a third pulse generator circuit. The second pulse generator circuit includes delay circuit 1122, inverter 1124, and NAND gate 1126. The second pulse generator circuit receives the delayed RW signal and produces a corresponding low level pulse at lead 1128. This low level pulse is applied to AND gate 1112, thereby producing a low level output signal /CTL_PLT_RW on lead 1116 at time $t_2$. The low level of output signal /CTL_PLT_RW turns on P-channel transistor 1152 and turns off N-channel transistor 1154. Simultaneously, the third pulse generator circuit, including delay circuit 1130, inverter 1132, and NAND gate 1134, produces a low level pulse on lead 1136. This low level pulse is applied to AND gate 1114, thereby producing a low level output signal /CTL_PLT_R on lead 1118 at time $t_2$. The low level of output signal /CTL_PLT_R turns off N-channel transistor 1156. Thus, P-channel transistor 1152 drives plateline signal PL high at time $t_2$.

After a time delay Δt produced by delay circuit 1122, inverter 1124 receives a high level signal and produces a corresponding low level signal at an input terminal of NAND gate 1126. Responsively, NAND gate 1126 produces a high level signal on lead 1128, thereby producing a high level of output signal /CTL_PLT_RW on lead 1116 at time $t_3$. The high level of output signal /CTL_PLT_RW turns off P-channel transistor 1152 and turns on N-channel transistor 1154. Delay circuit 1130 of the third pulse generator circuit, however, produces a low level pulse width of time Δ2t for output signal /CTL_PLT_R. Thus, N-channel transistor 1156 remains off at time $t_3$. Plateline signal PL, therefore, is driven low only by N-channel transistor 1154 at time $t_3$. The effective width-to-length ratio of P-channel transistor 1152 to N-channel transistor 1154 is 4. The fall time 1202 of plateline signal PL at time $t_3$, therefore, is preferably at least twice the fall time 1204 at time $t_1$ and the rise time 1200 at time $t_2$ of plateline signal PL. This extended fall time, while bitline BL is driven low (FIG. 5B), advantageously reduces current through N-channel pass gate resistance 114 as previously discussed. Current through resistance 114 is reduced during burn-in as well as during normal operation. Thus, the maximum gate-to-source voltage of pass gate transistor 102 is reduced, and the latchup potential due to minority carrier injection is eliminated. Reliability of the ferroelectric memory circuit is greatly improved. Furthermore, a greater reduction in width of N-channel transistor 1154 to W/6 or W/8 practically eliminates capacitive coupling and resulting gate-to-source voltage increases at the pass gate transistor.

Finally, after time delay Δ2t produced by delay circuit 1130, inverter 1134 receives a high level signal and produces a corresponding low level signal at an input terminal of NAND gate 1134. Responsively, NAND gate 1134 produces a high level signal on lead 1136, thereby producing a high level of level output signal /CTL_PLT_R on lead 1118 approximately one delay time Δt after time $t_3$. Thus, output signal /CTL_PLT_R turns on N-channel transistor 1156 until the next read or write cycle. The width-to-length ratio of P-channel transistor 1152 to combined N-channel transistors 1154 and 1156 is 2. This final ratio strongly drives plateline signal PL low to minimize capacitive coupling from other signal lines in the ferroelectric memory array.

Figure 13:
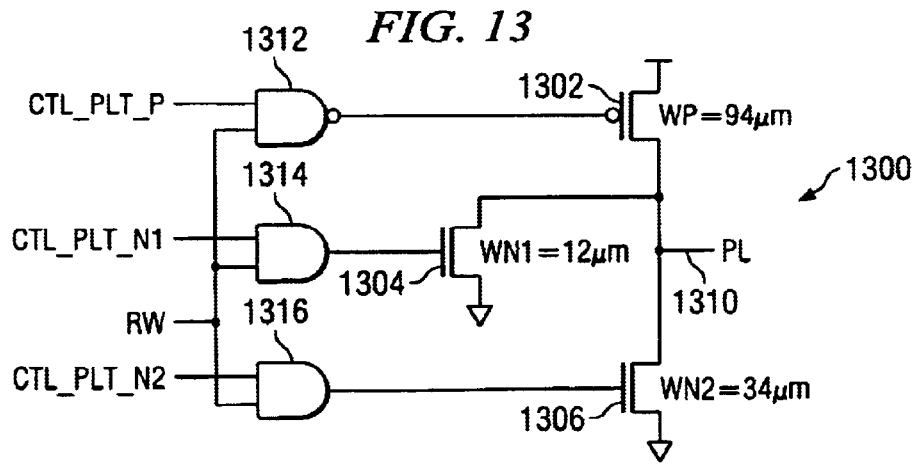
FIG. 13 is circuit diagram of a third embodiment of the plateline drive circuit of the present invention.
Figure 14:
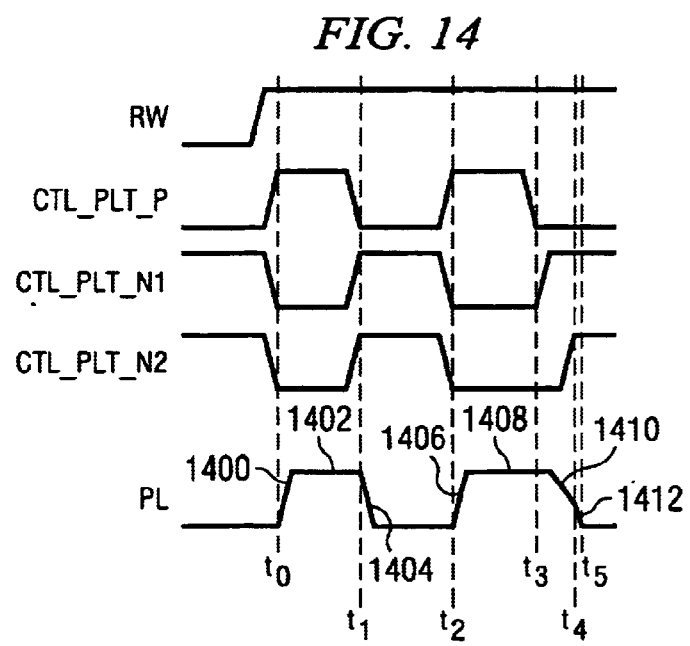
FIG. 14 is a timing diagram of the plateline drive circuit of FIG. 13.
Figure 15:
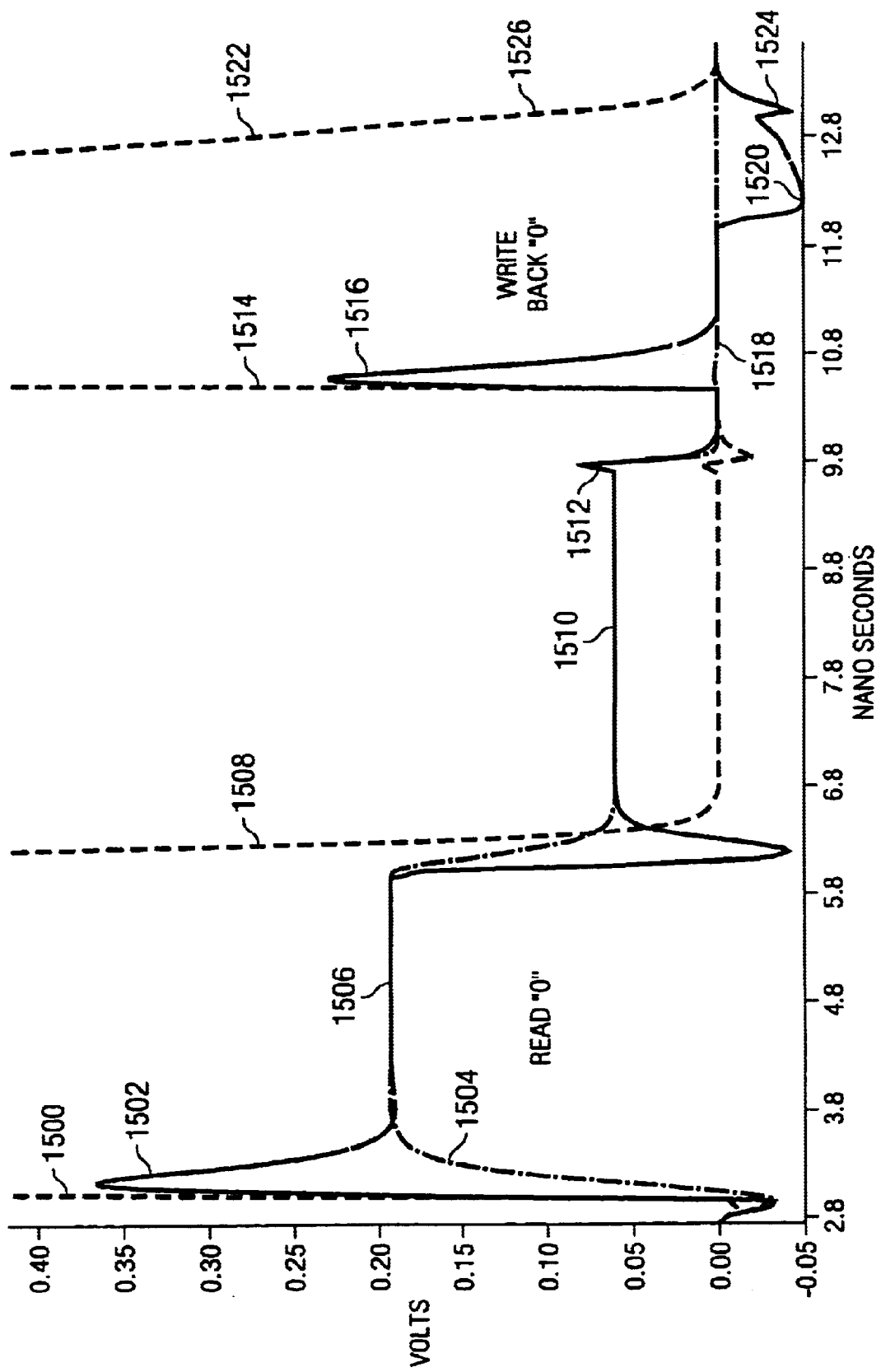
FIG. 15 is a simulation of the plateline drive circuit of FIG. 13.

Turning now to FIGS. 13 and 14, a third embodiment of the present invention will be explained in detail. A plateline control circuit 1300 (FIG. 13) includes a P-channel transistor 1302 having a control gate coupled to an output terminal of NAND gate 1312 and having a drain terminal coupled to output terminal 1310. P-channel transistor 1302 preferably has a width of 94 μm. N-channel transistors 1304 and 1306 have drain terminals coupled to output terminal 1310 and control gates coupled to AND gates 1314 and 1316, respectively. N-channel transistors 1304 and 1306 preferably have widths of 12 μm and 34 μm, respectively. Output terminal 1310 is coupled to a plateline terminal 110 (FIG. 8) of a ferroelectric memory cell and produces plateline pulse signal PL.

In operation, NAND gate 1312 and AND gates 1314 and 1316 are enabled by a high level of read/write signal RW (FIG. 14). At time $t_0$, control signal CTL_PLT_P goes high and control signals CTL_PLT_N1 and CTL_PLT_N2 go low. The low levels of control signals CTL_PLT_N1 and CTL_PLT_N2 drive control gates of N-channel transistors low, turning them off. The high level of CTL_PLT_P drives the control gate of P-channel transistor 1302 low, thereby driving the plateline signal PL at terminal 1310 high. The rate of change of voltage with respect to time of the first edge 1400 of a first plateline pulse 1402 is, therefore, determined by P-channel transistor 1302. The high level plateline signal PL couples a data signal of a selected memory cell to a respective bitline to produce a difference voltage as previously explained. At time $t_1$, CTL_PLT_P goes low and control signals CTL_PLT_N1 and CTL_PLT_N2 go high. These high levels turn on N-channel transistors 1304 and 1306, thereby driving plateline signal PL low. The rate of change of voltage with respect to time of the second edge 1404 of the first plateline pulse 1402 is, therefore, determined by N-channel transistors 1304 and 1306 operating in parallel. While plateline signal PL is low, a sense amplifier corresponding to the selected memory cell is activated to amplify the difference voltage. The sense amplifier, therefore, preferably produces at each bitline approximately 0 V for memory cells that stored a "0" and 1.3 V for memory cells that stored a "1". This amplified difference voltage produced by the sense amplifier is conducted to an output terminal (not shown) via the data path.

Figure 8:
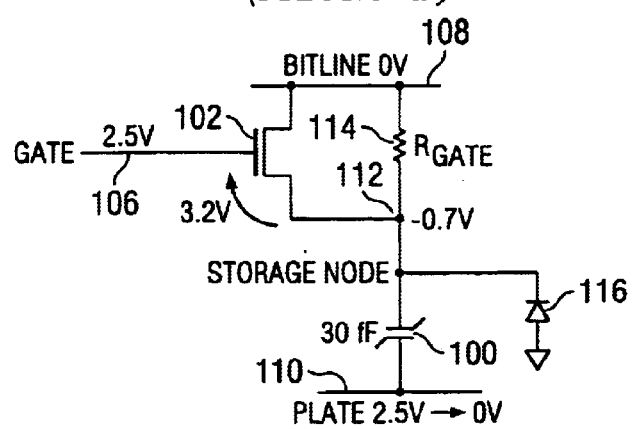
FIG. 8 is a simplified circuit diagram showing negative voltage coupling to the pass transistor storage node of FIG. 1.

CTL_PLT_P goes high and control signals CTL_PLT_N1 and CTL_PLT_N2 go low to initiate a second pulse 1408 of the plateline signal PL at time $t_2$. The rate of change of voltage with respect to time of the first edge 1406 of the second plateline pulse 1408 is also determined by P-channel transistor 1302. This second high level of plateline signal PL writes back a "0" into any selected memory cell that previously stored a "0". At time $t_3$, the "0" write back is complete, and CTL_PLT_P goes low and control signal CTL_PLT_N1 goes high. This high level turns on N-channel transistor 1304 and initiates a high-to-low transition of plateline signal PL. The small 12 μm width of N-channel transistor 1304 produces a second edge 1410 of the second pulse 1408 having a slow fall time of plateline signal PL. The maximum rate of change of voltage with respect to time of this second edge 1410 is preferably smaller in magnitude than the maximum rate of change of voltage with respect to time of either of edges 1404 or 1406. This slow fall time advantageously reduces the negative voltage coupled to the storage node 112 (FIG. 8). After a short delay at time $t_4$, control signal CTL_PLT_N2 goes high, thereby turning on N-channel transistor 1306. The greater 34 μm width of N-channel transistor 1306 together with the 12 μm width of N-channel transistor 1304 greatly decreases the fall time and drives plateline signal PL low at time $t_5$. The resulting maximum rate of change of voltage with respect to time of this third edge 1412 is preferably greater in magnitude than the maximum rate of change of voltage with respect to time of the adjacent second edge 1410. This decreased fall time of the third edge provides more time for data "1" write back to memory cells that previously stored a "1", thereby reducing the memory read cycle time.

Referring now to FIGS. 8 and 13–15, there is a simulation of the memory read cycle of a data "0" storage cell described with regard to FIG. 14. The vertical scale in volts is expanded to show critical voltages from –50 mV to –400 mV. The memory read cycle begins with a positive transition of plateline signal PL 1500. This positive transition couples a positive voltage 1502 to storage node 112. The storage node 112 shares charge with the bitline 108, producing a voltage increase 1504 to an equilibrium voltage 1506 of 193 mV through N-channel pass gate transistor 102. The plateline signal returns low 1508 at the end of the first pulse. This low transition couples the storage node 112 and bitline 108 to an equilibrium voltage 1510 of approximately 59 mV prior to sensing. Sense amplifier activation induces a small voltage spike 1512 on the storage node 112 and bitline 108, then amplifies the difference voltage and drives the bitline and storage node to 0 V.

A rising edge 1514 of a second plateline PL pulse couples the sense node 112 high 1516. The bitline 108, however, is held low 1518 by the sense amplifier, thereby writing back a "0" in the selected memory cell. Control signal CTL_PLT_N1 goes high at time $t_3$, turning on N-channel transistor 1304 and producing a relatively slow falling edge 1522 of plateline signal PL 1522. This relatively slow falling edge preferably couples a maximum 1520 of –50 mV to storage node 112. This limited negative excursion of the storage node 112 greatly reduces stress across the gate oxide of N-channel pass gate transistor 102 as previously discussed. Subsequently, control signal CTL_PLT_N2 goes high at time $t_4$, turning on N-channel transistor 1306 and greatly increasing the plateline signal PL fall time 1526. The falling edge of plateline signal PL 1526 couples a second and smaller negative voltage spike 1524 to storage node 112. This two-phase pull down of plateline signal PL, therefore, minimizes negative voltage coupling to storage node 112 without significantly reducing read memory cycle time. Moreover, the two-phase pull down greatly reduces gate oxide stress at the N-channel pass gate 102, thereby increasing long-term reliability of the ferroelectric memory.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the circuit producing the second plateline pulse signal 1408 of FIG. 14 may be readily adapted to single pulse systems as described with respect to FIG. 9. It is therefore intended that the appended claims encompass any such modifications or embodiments.

What is claimed is:

1. A method of operating a memory circuit, comprising the steps of:

applying a first control signal to a gate of a memory cell transistor;

applying a second control signal pulse having a first edge and a second edge to the memory cell, the second edge having a maximum rate of change of voltage with respect to time that is smaller in magnitude than a maximum rate of change of voltage with respect to time of the first edge; and accessing the memory cell in response to the first and second control signals.

2. A method as in claim 1, wherein the nonvolatile memory cell is a ferroelectric memory cell.

3. A method as in claim 2, wherein the nonvolatile memory cell comprises Lead Zirconate Titanate (PZT).

4. A method as in claim 2, wherein the nonvolatile memory cell comprises Strontium Bismuth Titanate (SBT).

5. A method as in claim 1, wherein the first control signal is a wordline signal, and wherein the second control signal is a plateline signal.

6. A method as in claim 1, wherein the step of accessing comprises one of reading and writing a datum from the memory cell.

7. A method as in claim 1, wherein the second control signal pulse comprises a third edge adjacent the second edge, the third edge having a maximum rate of change of voltage with respect to time that is different in magnitude than the maximum rate of change of voltage with respect to time of the second edge.

8. A memory circuit, comprising:

a memory cell for storing data, the memory cell having a first and a second control terminal;

a pass transistor having a control gate coupled to the first control terminal;

a first transistor of a first conductivity type having a current path coupled to the second control terminal and arranged to produce a first edge of a pulse; and a second transistor of a second conductivity type having a current path coupled to the second control terminal and arranged to produce a second edge of the pulse, the second edge having a maximum rate of change of voltage with respect to time that is smaller in magnitude than a maximum rate of change of voltage with respect to time the first edge.

9. A memory circuit as in claim 8, wherein the memory cell is a ferroelectric memory cell.

10. A memory circuit as in claim 8, wherein the first control terminal is a wordline terminal.

11. A memory circuit as in claim 8, wherein the second control terminal is a plateline terminal.

12. A memory circuit as in claim 8, comprising a third transistor of the second conductivity type having a current path coupled to the second control terminal, the second and third transistor arranged to produce a third edge of the pulse adjacent the second edge.

13. A memory circuit as in claim 8, comprising a third transistor of the second conductivity type having a current path coupled to the second control terminal, the third transistor having a greater width-to-length ratio than the second transistor, the third transistor arranged to produce a third edge of the pulse adjacent the second edge.

14. A memory circuit, comprising:
   a memory cell for storing data, the memory cell having a first and a second control terminal;
   a pass transistor having a control gate coupled to the first control terminal;
   a first transistor of a first conductivity type having a current path coupled to the second control terminal and arranged to produce at least one of a first edge of a first pulse and a first edge of a second pulse;
   a second transistor of a second conductivity type having a current path coupled to the second control terminal and arranged to produce a second edge of the first pulse and a second edge of the second pulse; and
   a third transistor of the second conductivity type having a current path coupled to the second control terminal and arranged to produce the second edge of the first pulse.

15. A memory circuit as in claim 14, wherein the memory cell is a ferroelectric memory cell.

16. A memory circuit as in claim 14, wherein the first control terminal is a wordline terminal and the second control terminal is a plateline terminal.

17. A memory circuit as in claim 14, wherein the second edge of the second pulse has a maximum rate of change of voltage with respect to time that is smaller in magnitude than a maximum rate of change of voltage with respect to time of the first edge of the second pulse.

18. A memory circuit as in claim 14, wherein the second edge of the second pulse has a maximum rate of change of voltage with respect to time that is smaller in magnitude than a maximum rate of change of voltage with respect to time of the second edge of the first pulse.

19. A memory circuit as in claim 14, wherein the second and a third transistor produce a third edge of the second pulse adjacent the second edge of the second pulse.

20. A memory circuit as in claim 14, wherein a third transistor produces a third edge of the second pulse adjacent the second edge of the second pulse, the third transistor having a greater width-to-length ratio than the second transistor.

21. A method of operating a memory circuit, comprising the steps of:
   applying a first control signal to a first terminal of a memory cell;
   applying a first pulse to a second terminal of the memory cell, the first pulse having a first edge and a second edge; and
   applying a second pulse to the second terminal, the second pulse having a first edge and a second edge, the second edge having a maximum rate of change of voltage with respect to time that is smaller in magnitude than a maximum rate of change of voltage with respect to time of the second edge of the first pulse.

22. A method as in claim 21, wherein the memory cell is a ferroelectric memory cell.

23. A method as in claim 21, wherein the first control terminal is a wordline terminal and the second control terminal is a plateline terminal.

24. A method as in claim 21, wherein the second pulse comprises a third edge adjacent the second edge, the third edge having a maximum rate of change of voltage with respect to time that is different in magnitude than a maximum rate of change of voltage with respect to time of the second edge of the second pulse.

25. A method of operating a memory circuit, comprising the steps of:
   applying a first control signal to a first terminal of a memory cell;
   applying a first pulse to a second terminal of the memory cell, the first pulse having a first edge and a second edge; and
   applying a second pulse to the second terminal, the second pulse having a first edge and a second edge, the second edge having a maximum rate of change of voltage with respect to time that is smaller in magnitude than a maximum rate of change of voltage with respect to time of the first edge of the second pulse.

26. A method as in claim 25, wherein the memory cell is a ferroelectric memory cell.

27. A method as in claim 25, wherein the first control terminal is a wordline terminal and the second control terminal is a plateline terminal.

28. A method as in claim 25, wherein the second pulse comprises a third edge adjacent the second edge, the third edge having a maximum rate of change of voltage with respect to time that is different in magnitude than a maximum rate of change of voltage with respect to time of the second edge of the second pulse.

* * * * *